United States Patent [19]

Chen et al.

[11] Patent Number: 5,763,316

[45] Date of Patent: Jun. 9, 1998

[54] SUBSTRATE ISOLATION PROCESS TO MINIMIZE JUNCTION LEAKAGE

[75] Inventors: Sen-Fu Chen, Taipei; Bao-Ru Yang, I-Lan; Wen-Cheng Chang, Hsin-chu, all of Taiwan

[73] Assignee: Taiwan Semiconductor Manufacturing Company, Ltd., Hsin-Chu, Taiwan

[21] Appl. No.: 800,977

[22] Filed: Feb. 19, 1997

[51] Int. Cl.$^6$ .................................................. H01L 21/76
[52] U.S. Cl. .................................................. 438/446
[58] Field of Search .......................... 438/446, 431, 438/232; 148/DIG. 85, DIG. 86

[56] References Cited

U.S. PATENT DOCUMENTS

| 4,471,525 | 9/1984 | Sasaki. |
|---|---|---|
| 4,666,556 | 5/1987 | Fulton et al.. |
| 5,318,922 | 6/1994 | Lim et al. .......... 437/70 |
| 5,326,715 | 7/1994 | Jang et al.. |
| 5,393,692 | 2/1995 | Wu. |
| 5,470,783 | 11/1995 | Chiu et al.. |
| 5,472,903 | 12/1995 | Lur. |
| 5,658,822 | 8/1997 | Wu et al.. |

*Primary Examiner*—George R. Fourson
*Attorney, Agent, or Firm*—George O. Saile; Stephen B. Ackerman

[57] ABSTRACT

A process for creating field oxide isolation for the micron and sub-micron devices in the high density integrated circuits has been developed. The junction leakage problem resulted from the trenches in the substrate formed after the removal of the silicon nitride mask, is avoided. The encroachment of the "bird's beak" into the small active device region is also minimized by this invention. These goals are accomplished by the addition of a polysilicon or amorphous silicon refill layer in the trenches after the removal of the silicon nitride oxidation mask in the isolation region, prior to field oxide oxidation process.

13 Claims, 4 Drawing Sheets

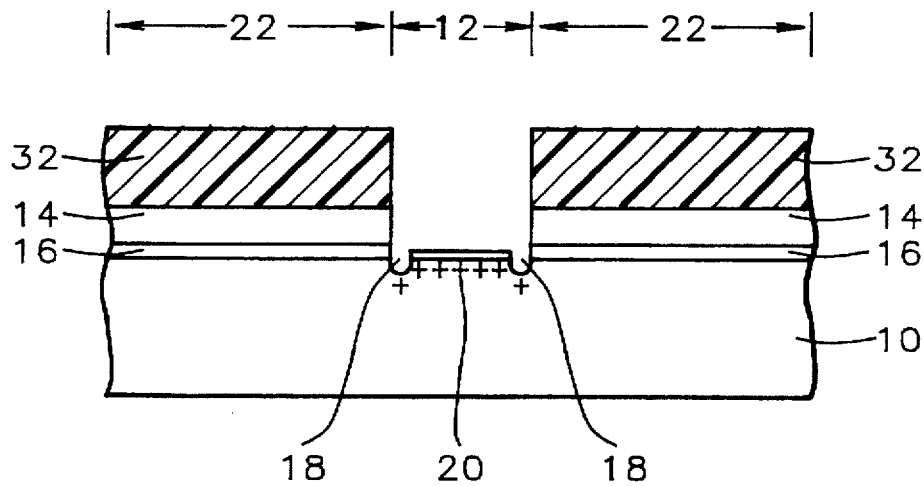
FIG. 1A – Prior Art
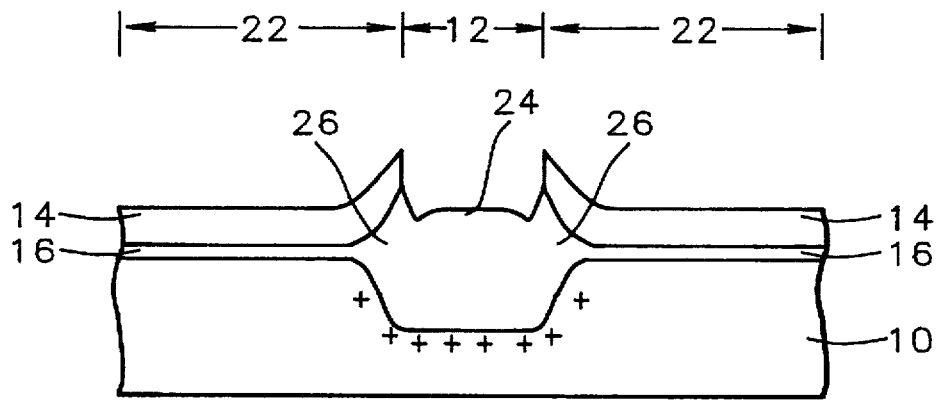
FIG. 1B – Prior Art
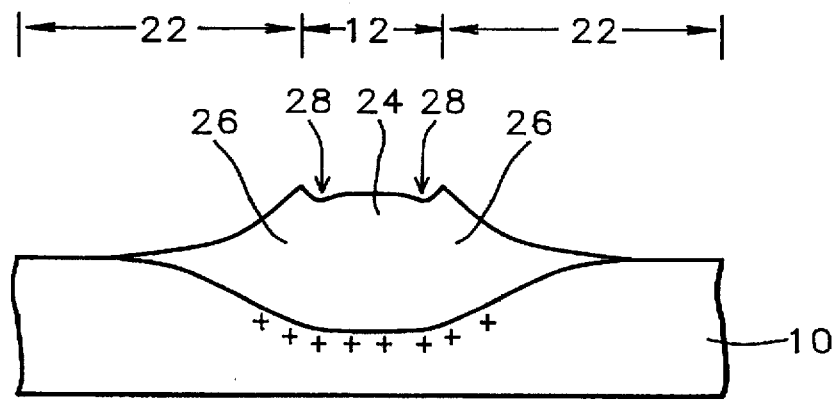
FIG. 1C – Prior Art

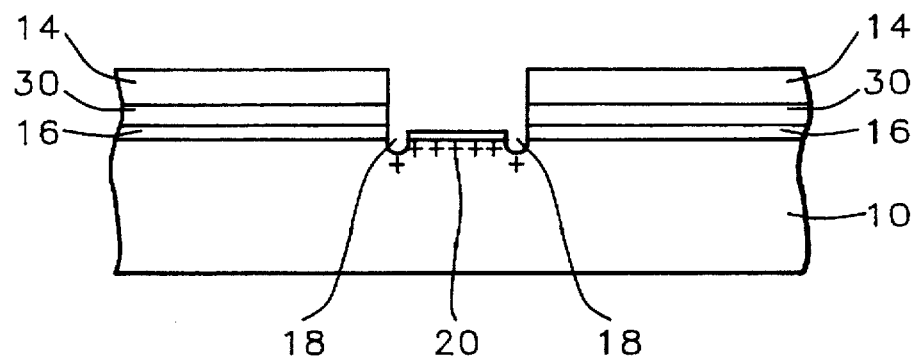
FIG. 2A – Prior Art
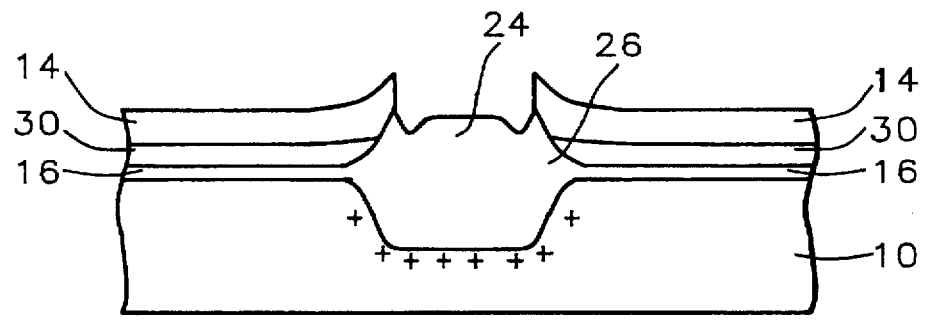
FIG. 2B – Prior Art
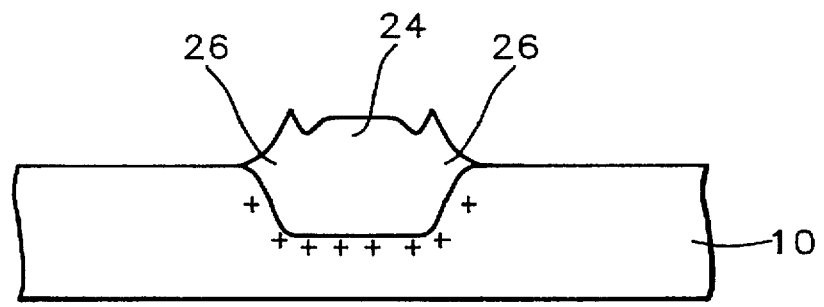
FIG. 2C – Prior Art

SUBSTRATE ISOLATION PROCESS TO MINIMIZE JUNCTION LEAKAGE

BACKGROUND OF THE INVENTION

1) Field of the Invention

This invention relates to methods used to fabricate high density integrated circuit chips consisting of semiconductor devices of micron and submicron dimensions and more specifically to improve a process used to form substrate isolation.

2) Description of Prior Art

With the availability of high resolution of semiconductor processing tools and techniques, the semiconductor industry has been able to manufacture micron and submicron devices and extremely high density integrated chips, thus, allowing more chips to be produced from a specific size starting silicon wafer, and consequently reducing the cost of a specific silicon chip.

The trend to micro-miniaturization must also include the attainment of a reliable, small dimension isolation between these small dimension devices in the high density circuits. In most instances, the isolation area in a high density circuit chip often exceeds the devices' area. Thereby, the reduction of the isolation dimension is not only crucial in reducing the overall chip size and cost of manufacturing but also resulting in faster circuit performances. However, the reduction of the isolation dimension can also increase the risk of reliability failures, such as leakage, latching and shorts.

One of the conventional isolation techniques used for integrated devices is the LOCOS (local oxidation of silicon). This LOCOS relates a technique in which a thick field oxide (FOX) is selectively grown on a semiconductor substrate to be the device isolation area, by growing a pad silicon oxide and a silicon nitride layer over the substrate. The isolation region is exposed by the conventional photolithographic and etching techniques. A thick oxide is grown over this exposed substrate area to form the FOX isolation, where the device region is prevented from oxidation by the nitride mask. However, during the FOX oxidation, the oxidation is not limited to the exposed silicon isolation area, during the oxidation the silicon oxide of the periphery of the isolation region, invariably extends laterally into the silicon of the device region which is under the nitride/pad oxide mask, on account of the filtration of the oxidizing agent, oxygen, and formed the "bird's beak" under the nitride. This encroachment of the isolation oxide into the device region, renders this isolation process inapplicable for fabrication of high density chips. Many variations of the LOCOS isolation process have been adopted such as SEPOX (selective polysilicon oxidation) and PB LOCOS (polysilicon buffered LOCOS) to reduce the encroachment of the "bird's beak" into the device region by depositing an intermediate layer of oxidizable material, such as polysilicon or amorphous silicon between the pad oxide and the nitride mask, thereby reducing the lateral oxidation of the silicon substrate under the pad oxide, by consuming major portion of the filtered oxygen from the FOX opening during the FOX high temperature oxidation toward the oxidation of the intermediate polysilicon layer hence reducing the amount of the filtered oxygen available to consume the silicon under the pad oxide to form "bird's beak". Another technique to reduce the "bird's beak" encroachment into the device's silicon region is by reducing the thickness of the pad oxide. However, the thin oxide pad is not sufficient to serve as protective barrier during the silicon nitride removal prior to the FOX oxidation as shown in FIG. 1, trenches were observed in the adjacent area between the FOX and the device regions which cause distortion of the FOX along the trench regions. Consequently, this distortion leads to junction leakage and has significant impact on the yield.

Byung-bak Lim et al in U.S. Pat. No. 5,318,922, have described an isolation method by forming an oxide nitride spacer on the sidewall of the pad oxide layer to suppress the-creation of the bird's beak formation due to lateral infiltration of oxide to the device region during the subsequent FOX oxidation step. This method reduces the bird's beak as well as the trench junction leakage problem, but the dimensions of the FOX on the chip are increased considerably, thus the sizes of the chips are increased and the number of the chips that can be obtained from a specific size of starting silicon wafer is reduced. This will in turn increase the manufacturing cost for a specific chip design.

This invention will describe a process to minimizing the trench and FOX distortion problem.

SUMMARY OF THE INVENTION

It is an object of this invention to provide a process for fabrication of isolation to be used for micron and submicron devices in high density, integrated circuits.

It is another object of this invention to prevent junction leakage that is caused by the distortion of the field oxide, resulting from the presence of trenches after the etching for the removal of the silicon nitride prior to the field oxide oxidation.

It is yet another object of this invention to fill the trench resulted from the etching process for the removal of the silicon nitride mask over the isolation region prior to the high temperature FOX formation.

It is still another object of this invention to fill the trench resulting from the removal of the silicon nitride mask in the isolation region by the a oxidizable refill layer.

And it is a further objective of this invention to preserve the integrity of the device area by reducing the "bird's beak" encroachment during the FOX oxidation. In particular, the improvement is by the deposition of a oxidizable material such as polysilicon, prior to FOX oxidation.

It is yet another object of this invention to reduce the "bird's beak" encroachment into the device region by depositing a layer of oxidizable material which will consume part of the oxygen diffused laterally underneath the silicon nitride mask over the device region, thereby minimize not only the "bird's beak" encroachment, but the distortion of field oxide due to the trench.

These and other objects and advantages of the present invention are achieved in accordance with the method and structure as disclosed herein, which provide a process for fabricating Field Oxide isolation of micron and submicron devices without junction leakage failure problems. More particularly, the fabrication method of the present invention comprises the steps of: (a) depositing a thin pad oxide and silicon nitride layer over the substrate; (b) exposing the field oxide isolation area by the conventional photolithographic & etching techniques; (c) depositing a layer of oxidizable material, such as, polysilicon to fill the trenches resulting from the etching and removal of the silicon nitride over the FOX area; (d) forming the isolation FOX oxide by thermal oxidation in oxygen ambient.

BRIEF DESCRIPTION OF THE DRAWINGS

These objects, features and advantages of the fabrication method and resulting micron and submicron devices and integrated circuits made thereby in accordance with this invention will become more apparent from the following detailed description thereof taken in conjunction with the accompanying drawings that include:

FIGS. 1A, 1B and 1C, which schematically, in cross-sectional style, show prior art, the conventional LOCOS fabrication sequences, used to form the isolation area.

FIGS. 2A, 2B, and 2C, which schematically in cross-sectional style, show prior art, the conventional SEPOX fabrication sequences, used to form the isolationa area.

DETAILED DESCRIPTION OF THE INVENTION

In the conventional LOCOS processed isolation, a substrate, 10, composed of <100> crystallographic orientation silicon, is used as shown in FIG. 1A. Thick field oxide, (FOX) region, 12, used for isolation purposes, are defined by an oxidation mask pattern composed of an overlying silicon nitride layer, 14, and an underlying pad silicon dioxide layer, 16. The composite insulator mask is patterned using the standard photolithographic and reactive ion etching (RIE) processes for the removal of the overlying silicon nitride in the exposed area, 12. However, during the removal of this silicon nitride film the underlying pad oxide is too thin to serve as an etch stop during the RIE removal process and this often results in trenches, 18, and trench defects, along the junction between the exposed isolation region and the device area. Prior to the field oxidation, impurity ions of the same conductivity as the substrate's conductivity type is implanted through the pad oxide screen to form a channel-stop layer, 20, for prevention of field inversion. The exposed silicon substrate area is then thermally oxidized at high temperature, approximately in the range of 900 to 1100 deg.C. in the steam and oxygen ambient, and the device area, 22, is supposedly prevented from oxidation by the silicon nitride mask. However, during this long and high temperature thermal oxidation of growing the field oxide (FOX) isolation, 24, the oxygen diffused laterally and forms the "bird's beak" oxide, 26, under the edge of the silicon nitride mask, as shown FIG. 1B, causing considerable encroachment of the oxide into the active device area by the "bird's beak" shaped lateral oxidation, and distortion of the field oxide over the trench area, 28, as shown in FIG. 1C. This extensive encroachment of the oxide into the active device area rendering this isolation inapplicable for fabrication of highly integrated small dimensional devices.

One of the conventional attempts to reduce the extension of the "bird's beak" oxidation, known as the SEPOX (selective polysilicon oxidation) is by the addition of an intermediate layer of polysilicon, 30, in between the overlying silicon nitride mask, 14, and the underlying pad oxide, 16, as shown in FIGS. 1A. & 1B. Though the SEPOX process reduces the size of the "bird's, but the lateral corrosion into the active device region remains to be a serious problem, especially in the submicron size devices and the trenches resulted from the etching of the silicon nitride for exposing the isolation area remain unchanged as shown in FIG. 2C. Furthermore, the trenches resulted from the removal etch of the silicon nitride mask still remains.

This invention will describe a method to minimize the trench and FOR distortion problem found in the reduced bird's beak isolation processings.

Figure 3A:
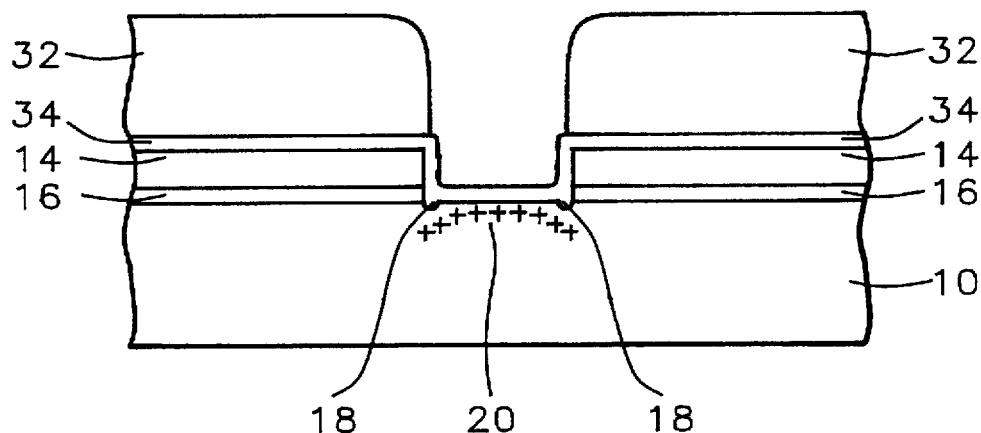
FIGS. 3A, 3B and 3C, which schematically in cross-sectional view of process sequences of the embodiment of the device isolation region formed according to the present invention.
Figure 3B:
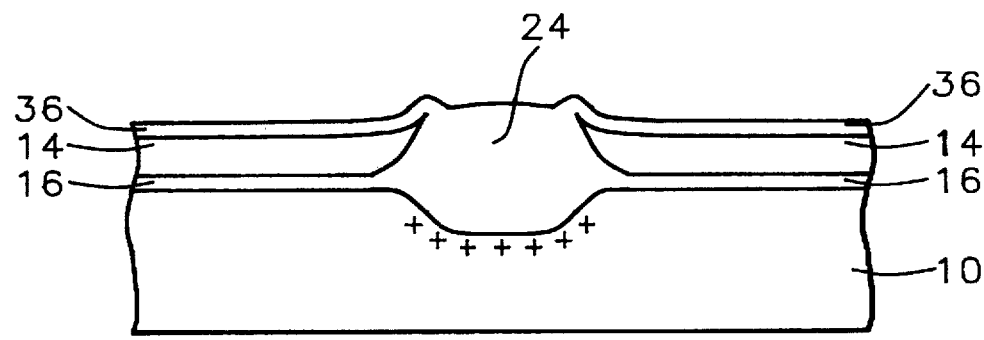
Figure 3C:
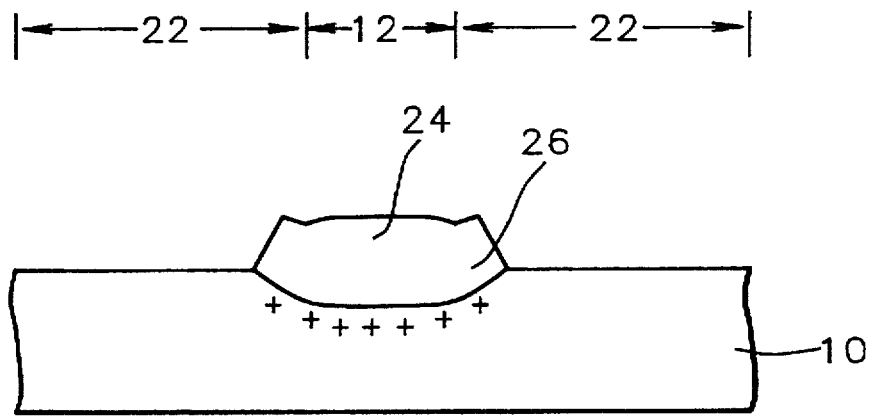

In the first embodiment of the present invention, as shown in FIGS. 3A, 3B, and 3C, there is provided a method of manufacturing the oxide isolation for high-density circuits with micron and submicron devices composing the steps of: sequentially forming a pad oxide, 16, having a thickness in the range of 15 to 15 nm, by thermal oxidation at temperatures about 900 to 920 deg.C. in oxygen ambient over the substrate, 10; depositing a silicon nitride layer, 14, of 135 to 170 nm in thickness by the plasma enhanced chemical deposition technique using ammonia, and silane at temperature between about 740 to 780 deg. C. over the underlying pad oxide; using the conventional photolithographic technique to define the isolation region, 12, with the photoresist, 32, (as shown in FIG. 3A), covering the pad oxide/silicon nitride stack over the device region, 22; removing the silicon nitride in the exposed area by the standard reactive ion etching, RIE, process using CHF and argon mixture of gases as etchants; ion-implanting boron or arsenic or phosphorus into the exposed substrate region, 20, to prevent substrate inversion at energy of 50 to 150 KeV with a dose between about 1E15 to 1E16 ions/cm$^2$; stripping the photoresist; and depositing a layer of oxidizable material, such as, amorphous silicon or polysilicon, 34, (as shown in FIG. 3B) of approximately 50 to 100 nm by the LPCVD technique at temperature ranging from 600 to 620 deg.C. using silane and hydrogen source gases to fill the trenches in the underlying substrate, 18, around the edge of the isolation region caused by the RIE etching of the silicon nitride, as the pad oxide is usually too thin to protect the substrate from the RIE of silicon nitride. This layer of polysilicon refill assists not only in lessening the distortion of the subseqnet field oxide isolation, to avoid the junction leakage problem, it further minimizes the size of the "bird's beak", 36, and its encroachment into the active device region, as shown in FIG. 3C, because, part of the lateral diffusion of oxygen during the FOX oxidation of the substrate in the isolation window extends into the area underneath the silicon nitride mask, is now partly consummed by this overlying polysilicon layer, 34, thereby, less penetration of "bird's beak" into the substrate in the active device region. After the deposition of this polysilicon refill layer, thick field oxide (FOX) 24, is formed in the isolation region, 12, via a steam/oxygen thermal oxidation at a temperature between about 900 to 1100 deg.C. to a thickness between about 400 to 600 nm. Following the FOX formation, the composite insulator oxidation mask over the device region is removed using hot phosphoric acid to remove the silicon nitride, and a buffered hydrofluoric acid solution for stripping the underlying silicon dioxide layer.

Figure 4:
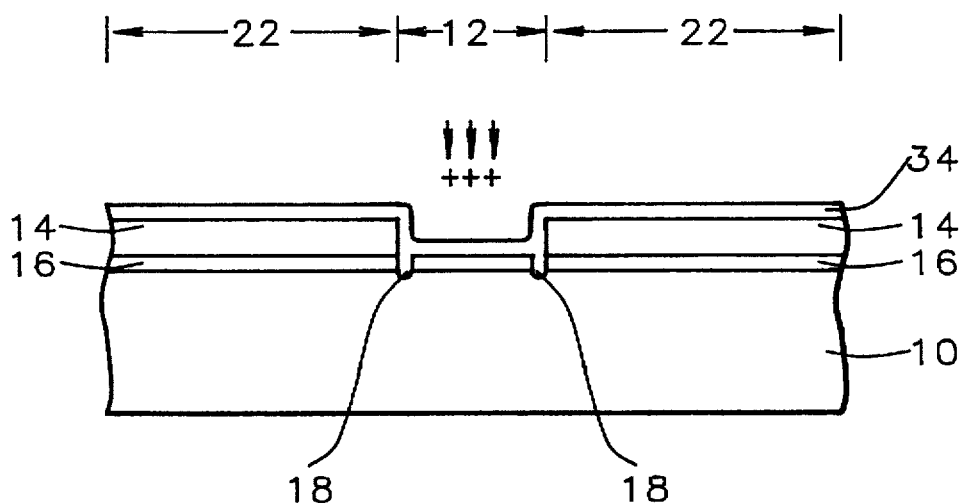
FIG. 4, which schematically in cross-sectional view of the second embodiment of the device isolation region formed according to the present invention.

A second embodiment of the present invention, consists of processing substantially as described in the first embodiment of this invention, except, the oxidizable re-fill material, such as polysilicon layer, 34, is deposited after the dry etch removal of the silicon nitride mask, but prior to the channel-stop ion-implant, as shown in FIG. 4. The thickness of the polysilicon layer, 34, is predetermined so that it should be thick enough to fill the trenches completely to decrease the distortion resulting from the subsequent thick FOX formation, yet at the same time to allow enough channel-stop ions to be implanted through the polysilicon into the substrate to have hard breakdown voltage through the self-aligned mask. The advantage of having this polysilicon layer deposited before the implant is that the polysilicon layer will be implanted with the channel-stop implant ions, thus it will not deplete the implanted ions from the substrate during the subsequent FOX oxidation to cause inversion, especially in the trench region.

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, it is not desired to limit the invention to the exact construction and operation shown and described and accordingly, all suitable modifications are equivalents may be resorted to, falling within the scope of the invention.

What is claimed is:

1. A method for fabricating oxide isolation for manufacturing semiconductor micron and submicron devices of high density circuits, by depositing an oxidizable refill layer, to prevent field oxide distortion, junction leakage defects and to minimize encroachment of the "bird's beak" into the active device region, comprising the steps of growing a dielectric layer as a pad layer over a semiconductor substrate;

depositing an insulating oxidation mask layer over said thin dielectric pad layer;

defining an isolation region from an active device region by anisotropic etching of said insulating oxidation mask layer in the isolation region whereby trenches are formed along the peripheral edges around the isolation region, exposing the semiconductor substrate in and around the trenches bordering the active device region;

depositing a layer of oxidizable material over the semiconductor substrate to fill said trenches along the edges of the isolation regions;

growing thermally a thick field oxide in said isolation region; and removal of the insulating mask layer over the active device area by using a selective etch.

2. The method of claim 1, wherein said dielectric layer over said semiconductor substrate is silicon dioxide.

3. The method of claim 1, wherein said insulating oxidation mask layer over the pad silicon dioxide layer is silicon nitride, deposited using either LPCVD or PECVD processing, at a temperature between about 740 to 790 deg.C. to a thickness of 135 to 170 nm with ammonia and silane as sources.

4. The method of claim 1, wherein said insulating oxidation mask layer in the isolation area is removed using anisotropic reactive ion etch processing with CHF3 as an etchant.

5. The method of claim 1, wherein inversion of the semiconductor substrate in the defined isolation region is prevented by a channel-stop ion-implant after the removal of the oxidation mask, but prior to said deposition of the oxidizable material.

6. The method of claim 1, wherein-inversion of the semiconductor substrate in the defined isolation region is prevented by a channel-stop ion-implant after the deposition of the oxidizable material.

7. The method of claim 5, wherein said channel-stop implantation ion is Group V element for-N-type substrate, and implantation is made at implant energy between about 25 to 30 KeV with a dose of 1E15 to 1E16 ions/cm$^2$.

8. The method of claim 5, wherein said channel-stop implantation ion is Group III element for P-type substrate, and implantation is made at implant energy between about 25 to 30 KeV with a dose of 1E15 to 1E16 ions/cm$^2$.

9. The method of claim 1, wherein said oxidizable layer is polysilicon deposited by the LPCVD method to a thickness between about 50 to 100 nm at a temperature between about 600 to 620 deg.C. using silane and hydrogen as source mixture.

10. The method of claim 1, wherein said oxidizable layer is amorphous silicon deposited by the LPCVD method to a thickness between about 50 to 100 nm at a temperature between about 540 to 570 deg. C. using silane as source.

11. The method of claim 1, wherein said field oxide is grown in an ambient consisting of steam and oxygen, at a temperature between about 940 to 980 deg.C. to a thickness between about 4000 to 6000 nm.

12. The method of claim 2, wherein the silicon nitride oxidation mask over the active device area is removed by the hot phosphoric acid.

13. The method of claim 2, wherein the pad silicon dioxide layer is removed by the buffered hydrofluoric acid.

* * * * *